(12) United States Patent
Li et al.

(10) Patent No.: US 11,942,393 B2
(45) Date of Patent: Mar. 26, 2024

(54) SUBSTRATE WITH THERMAL INSULATION

(71) Applicant: Intel Corporation, Santa Clara, CA (US)

(72) Inventors: Wei Li, Chandler, AZ (US); Edvin Cetegen, Chandler, AZ (US); Nicholas S. Haehn, Scottsdale, AZ (US); Mitul Modi, Phoenix, AZ (US); Nicholas Neal, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 903 days.

(21) Appl. No.: 16/781,563

(22) Filed: Feb. 4, 2020

(65) Prior Publication Data
US 2021/0242107 A1    Aug. 5, 2021

(51) Int. Cl.
*H01L 23/373* (2006.01)
*H01L 23/00* (2006.01)
*H01L 23/367* (2006.01)
*H01L 23/522* (2006.01)
*H01L 23/538* (2006.01)

(52) U.S. Cl.
CPC ........ *H01L 23/3735* (2013.01); *H01L 23/367* (2013.01); *H01L 23/3736* (2013.01); *H01L 24/16* (2013.01); *H01L 24/81* (2013.01); *H01L 23/5226* (2013.01); *H01L 23/5384* (2013.01); *H01L 2224/16225* (2013.01); *H01L 2224/81203* (2013.01)

(58) Field of Classification Search
CPC .............. H01L 23/3735; H01L 23/367; H01L 23/3736; H01L 24/16; H01L 24/81; H01L 2224/16225; H01L 2224/81203; H01L 23/36; H01L 23/3677; H01L 2224/131; H01L 2224/81815; H01L 23/49822; H01L 2224/75251; H01L 2224/75252; H01L 2224/81007; H01L 23/5226; H01L 23/5384
See application file for complete search history.

(56) References Cited

U.S. PATENT DOCUMENTS

2012/0228503 A1* 9/2012 Nishikawa ................ G01J 5/04
250/338.3
2015/0228583 A1* 8/2015 Karhade ............. H01L 23/5226
257/776

\* cited by examiner

*Primary Examiner* — Patricia D Valenzuela
(74) *Attorney, Agent, or Firm* — Schwabe, Williamson & Wyatt, P.C.

(57) ABSTRACT

Embodiments herein relate to systems, apparatuses, or processes directed to a substrate that includes a first region to be coupled with a die, and a second region separate and distinct from the first region that has a lower thermal conductivity than the first region, where the second region is to thermally insulate the first region when the die is coupled to the first region. The thermal insulation of the second region may be used during a TCB process to increase the quality of each of the interconnects of the die by promoting a higher temperature at the connection points to facilitate full melting of solder.

16 Claims, 4 Drawing Sheets

SUBSTRATE WITH THERMAL INSULATION

FIELD

Embodiments of the present disclosure generally relate to the field of package assemblies, and in particular package assemblies using thermal compression bonding (TCB).

BACKGROUND

Continued reduction in end product size of mobile electronic devices such as smart phones and ultrabooks is a driving force for the development of reduced-size package components.

DETAILED DESCRIPTION

Figure 1:
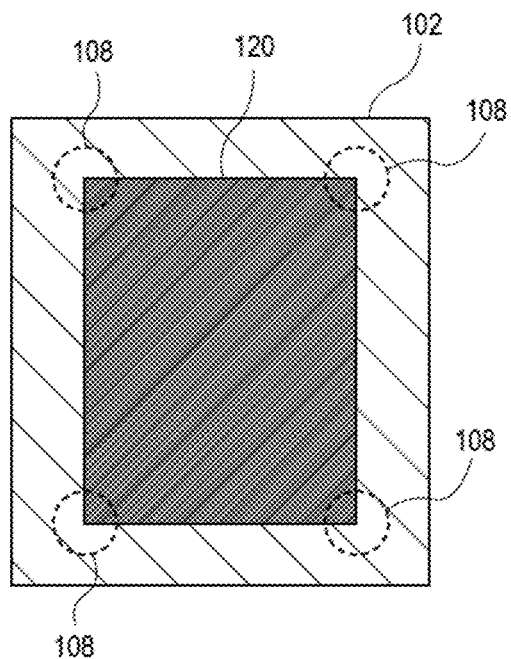
FIG. 1 illustrates a top-down view of a legacy implementation of a die to be attached to a substrate.

Embodiments of the present disclosure may generally relate to systems, apparatus, and/or processes directed to a substrate that includes a first region to be coupled with a die, and a second region separate and distinct from the first region that has a lower thermal conductivity than the first region, where the second region is to thermally insulate the first region when the die is coupled to the first region. In embodiments, the thermal insulation of the second region may be used during a TCB process to increase the quality of each of the interconnects of the die by promoting a higher temperature at the connection points to facilitate full melting of solder. As described herein, references to the TCB process may also refer to any local heating process used to bond a die to a substrate.

In particular, embodiments may increase first level interconnect (FLI) corner bump temperatures, and therefore improve joint quality for the TCB process. In legacy implementations, during the TCB process, there may be large temperature gradients between center bumps and corner bumps of a die to be attached to the substrate. The corner bumps have the lowest temperature due to in-plane thermal conductivity, and therefore the shortest time above liquidus temperature. As a result, the corner bump attachments may have poorer joint quality.

In legacy implementations, first level interconnect corner bumps may not achieve a melting temperature during TCB due to extra heat loss through the substrate. In embodiments, removing copper traces, vias, or other thermally conductive features proximate to a die corner region on the substrate may dramatically improve corner bump temperatures and increase corner bump joint quality. In embodiments, these thermally conductive features may be removed by removing layers of the substrate.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates a legacy implementation of a die to be attached to a substrate. A substrate 102 is shown where a die 120 is placed on the substrate 102. In this example, a first level interconnect (FLI) 126 of FIG. 2 may be used to couple the die 120 to the substrate 102. TCB techniques, or other localized heating techniques, may be used to heat the die 120 and/or the substrate 102 in order to cause solder to reach a liquidus state to form a quality first level interconnect 126 bonding.

Figure 2:
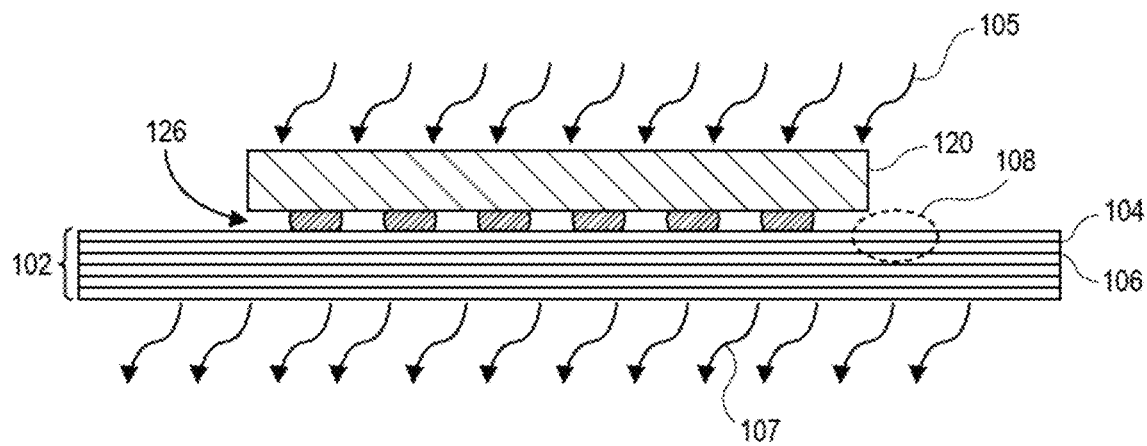
FIG. 2 illustrates a side view of a die attached to a substrate that includes metallic layers, in accordance with embodiments.

These legacy heating techniques will likely not result in a uniform level of thermal energy transferred to the FLI 126. In particular, in regions 108 at a corner of the die 120 where the substrate 102 may include copper traces, copper vias, or other thermally conductive elements or features in layers 104, 106, as shown in FIG. 2, of the substrate 102. These elements within the substrate 102, particularly in region 108, will pull heat away from the corner bumps of the FLI 126 of the die 120 due to in-plane thermal conductivity, which may then make the corresponding corner bumps of FLI 126 near region 108 too cool to achieve a quality bonding.

FIG. 2 illustrates a side view of a die attached to a substrate that includes metallic layers. Die 120 shows that applied heat 105 to the die 120 passes through the FLI 126. In embodiments, the heat will melt the various solder bumps in the FLI 126 to create joints and to physically and electrically couple the die 120 to the substrate 102. After passing through the FLI 126, the heat 107 is dissipated into the substrate 102. Various metallic layers 104, 106 within the substrate 102 may be highly thermally conductive and excessively draw heat away from corner bumps of the FLI 126 near the region 108. This may result in quality issues for corner or edge regions of the FLI 126.

Figure 3:
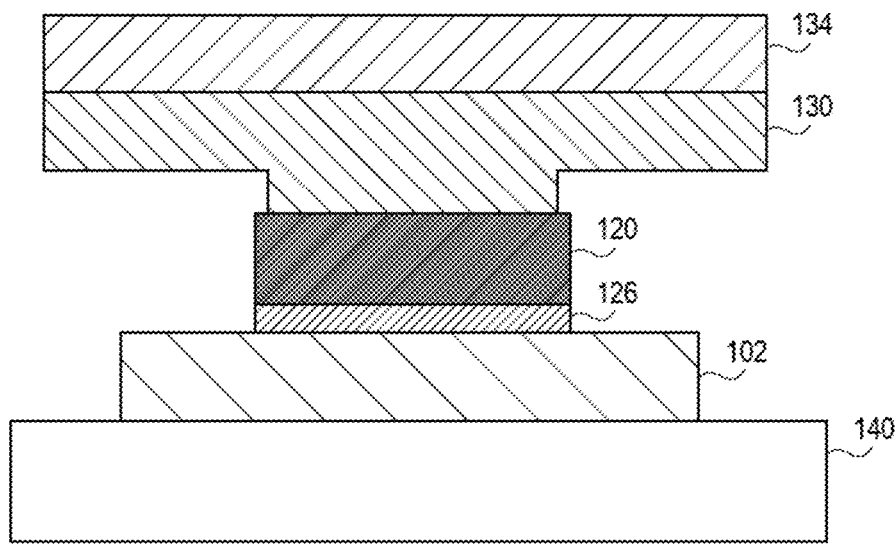
FIG. 3 illustrates a TCB mechanism to attach a die to a substrate.

FIG. 3 illustrates a thermal compression bonding (TCB) mechanism to attach a die to a substrate. A bonding head 134 is used to generate heat that is transferred to the die 120 in order to melt solder for the individual connections in the FLI 126. The bonding head 134 is thermally coupled to a nozzle 130 that may be custom-designed for a particular size or other characteristic for the die 120. A pedestal 140 may be thermally coupled with the substrate 102, and may be used to transfer heat to the substrate 102 and to the FLI 126.

Legacy embodiments using TCB, have attempted to increase the heat of each element of the FLI 126 in an attempt to get a higher quality bonding by either increasing the TCB bond head 134 temperature, increasing the TCB pedestal 140 temperature, or increasing a holding time at the peak bond head temperature to allow sufficient heat to flow to the corners of die 120. Each of these legacy implementations have challenges.

Extra holding time in the TCB process will result in a major reduction in the machine operation rate (MOR) of these packages. In legacy implementations, process time may have to increase from a few seconds to tens of seconds to see a significant temperature increase for die 120 corner bumps of the FLI 126.

In legacy implementations, a reason for a lower corner bump temperature as compared with center bumps in the FLI 126 is the in-plane heat loss to the substrate 102, particularly at region 108 of FIG. 2. For center bumps of the FLI 216, the heat transfer is only one-dimensional through stack-up of bond head 134, nozzle 130, die 120, FLI 126 bumps, substrate 102 and pedestal 140. However, for corner bumps, proximate to region 108 of FIG. 2 for example, there is three-dimensional heat loss due to large in-plane thermal conductivity of substrate 102. This may be due to large copper concentrations in those regions 108, in particular at top copper layers 104, which cause high in-plane thermal conductivity within the substrate 102. By reducing copper concentration in corners through substrate design, the TCB process quality and throughput can be improved substantially.

Figure 4:
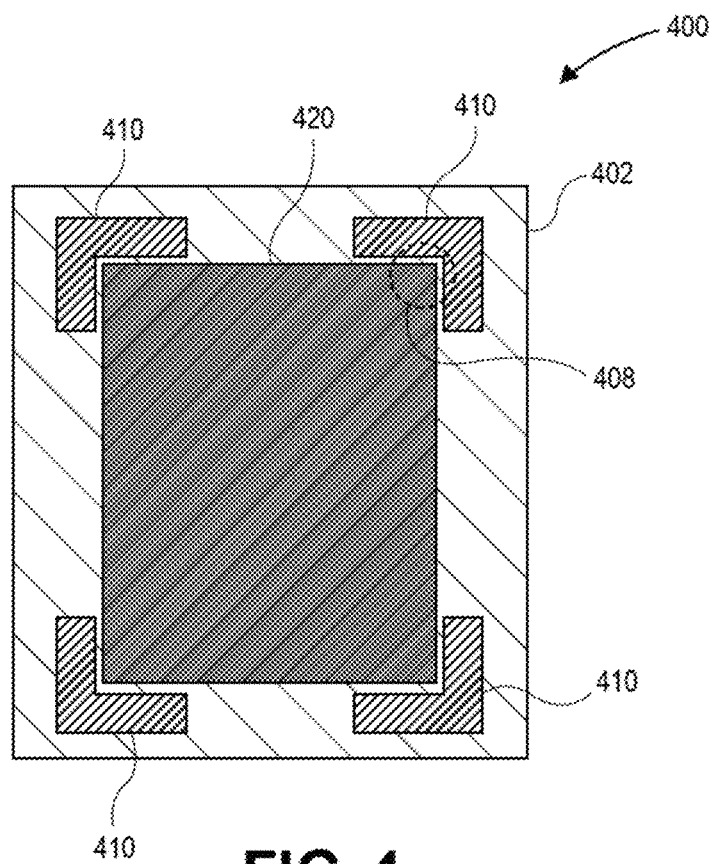
FIG. 4 illustrates examples of corner insulation to improve TCB of dies to a substrate, in accordance with embodiments.

FIG. 4 illustrates examples of corner insulation to improve the TCB of dies to a substrate, in accordance with embodiments. Diagram 400 shows a die 420, which may be similar to die 120 of FIG. 1, to be coupled to a substrate 402 which may be similar to substrate 102 of FIG. 1. Thermal insulated corner regions 410 are shown that have a lower thermal conductivity than the thermal conductivity of substrate 402. As a result, during TCB of the die 420 to the substrate 402, less heat in the die corner regions 408 will dissipate into the substrate 402 because of the thermal insulation property of the corner regions 410, resulting in a higher temperature in the die corner regions 408. As a result, the FLI 126 of FIG. 3 between the die 420 in the substrate 402 will be at a higher temperature for a higher quality die bonding during the TCB process.

In embodiments, the thermal insulated corner regions 410 may be of any shape or any size and be located anywhere within substrate 402 as needed to increase the temperature of a region of the substrate 402. The increase of temperature may be for a TCB process as described above, or for any other process for which a temperature differential in the substrate 402 is desired.

In embodiments, the thermal insulated corner regions 410 are cavities within the substrate 402 that are formed by removal of thermally conductive elements in the surface layers of the substrate 402. The removed surface layers, which may be similar to layers 104, 106 of FIG. 2, may include metallic layers, or layers that include metallic traces such as copper traces used as a redistribution layer (RDL). The removed surface layers may also include metallic features such as copper traces, vias, or other thermally conductive features proximate to a die corner or die side region. These surface layers, in embodiments, may be removed during design of the substrate, or may be physically removed from the substrate and later filled in with a dielectric material or with some other material that has a reduced thermal conductivity.

In embodiments, the thermal insulated corner regions 410 may be created by removing portions of the substrate 402 starting at a surface or at a bottom of the substrate 402. In embodiments, the thermal insulated corner regions 410 may be built within the substrate 402 during manufacture. As a result, a region of the substrate 402 underneath the die 420, to which a FLI 126 of FIG. 3 is to be coupled, will reach an overall higher temperature with lower temperature gradients, particularly with respect to region 408, in comparison to legacy implementations.

Figure 5:
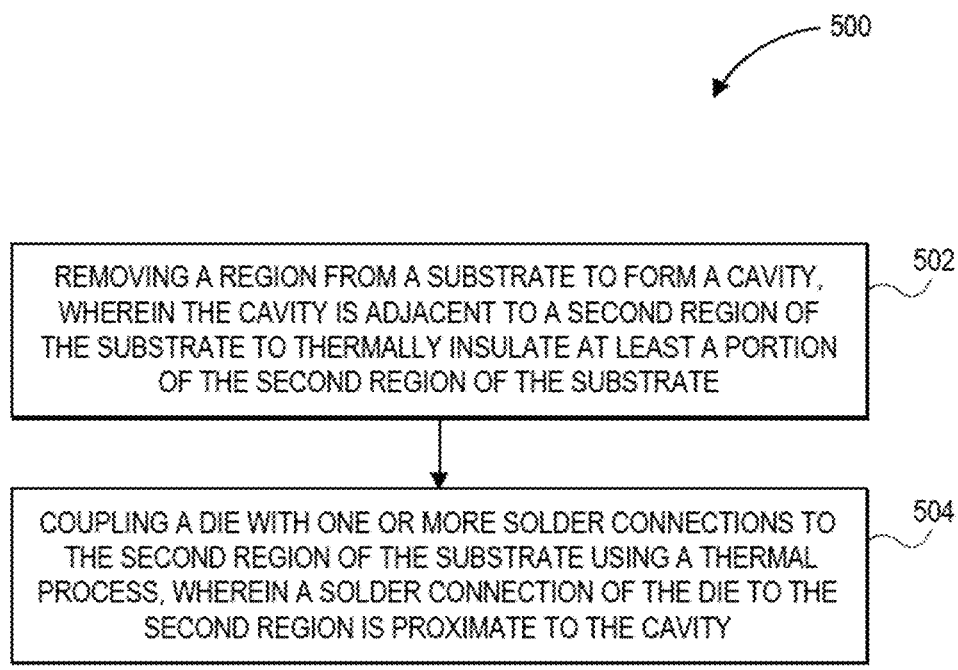
FIG. 5 illustrates an example of a process to implement corner insulation on a substrate, in accordance with embodiments.

FIG. 5 illustrates an example of a process to implement corner insulation on a substrate, in accordance with embodiments. Process 500 may be performed by one or more elements, techniques, or systems that may be described with respect to FIGS. 1-4.

At block 502, the process may include removing a region from a substrate to form a cavity, wherein the cavity is adjacent to a second region of the substrate to thermally insulate at least a portion of the second region of the substrate. In embodiments, the substrate may be similar to substrate 402 of FIG. 4, and the removed region may correspond to or be similar to corner region 410 of FIG. 4. In embodiments, the cavity may be filled with a dielectric or some other material having a lower thermal conductivity than the substrate. The second region of the substrate may be similar to the portion of the substrate below die 420 of FIG. 4. The portion of the substrate may include one or more portions of a FLI which may be similar to FLI 126 of FIG. 3. The lower thermal conductivity of the cavity serves to thermally insulate at least a portion of the second region of the substrate by reducing in-plane heat loss from the second region of the substrate.

At block 504, the process may include coupling a die with one or more solder connections to the second region of the substrate using a thermal process, wherein a solder connection of the die to the second region is proximate to the cavity. In embodiments, the die may be similar to die 420 of FIG. 4. The one or more solder connections may include solder bumps, or other connection elements used a couple a die 420 with a substrate 402. The connections may be similar to connections of FLI 126 of FIG. 3. During the thermal process, which may be a TCB process, the cavity will provide in-plane insulation within the substrate 402 in order to raise the temperature and reduce the thermal gradients in the second region of the substrate. This increase the quality of the connections between the dies and the substrate and reduce the time required to bond the dies.

Figure 6:
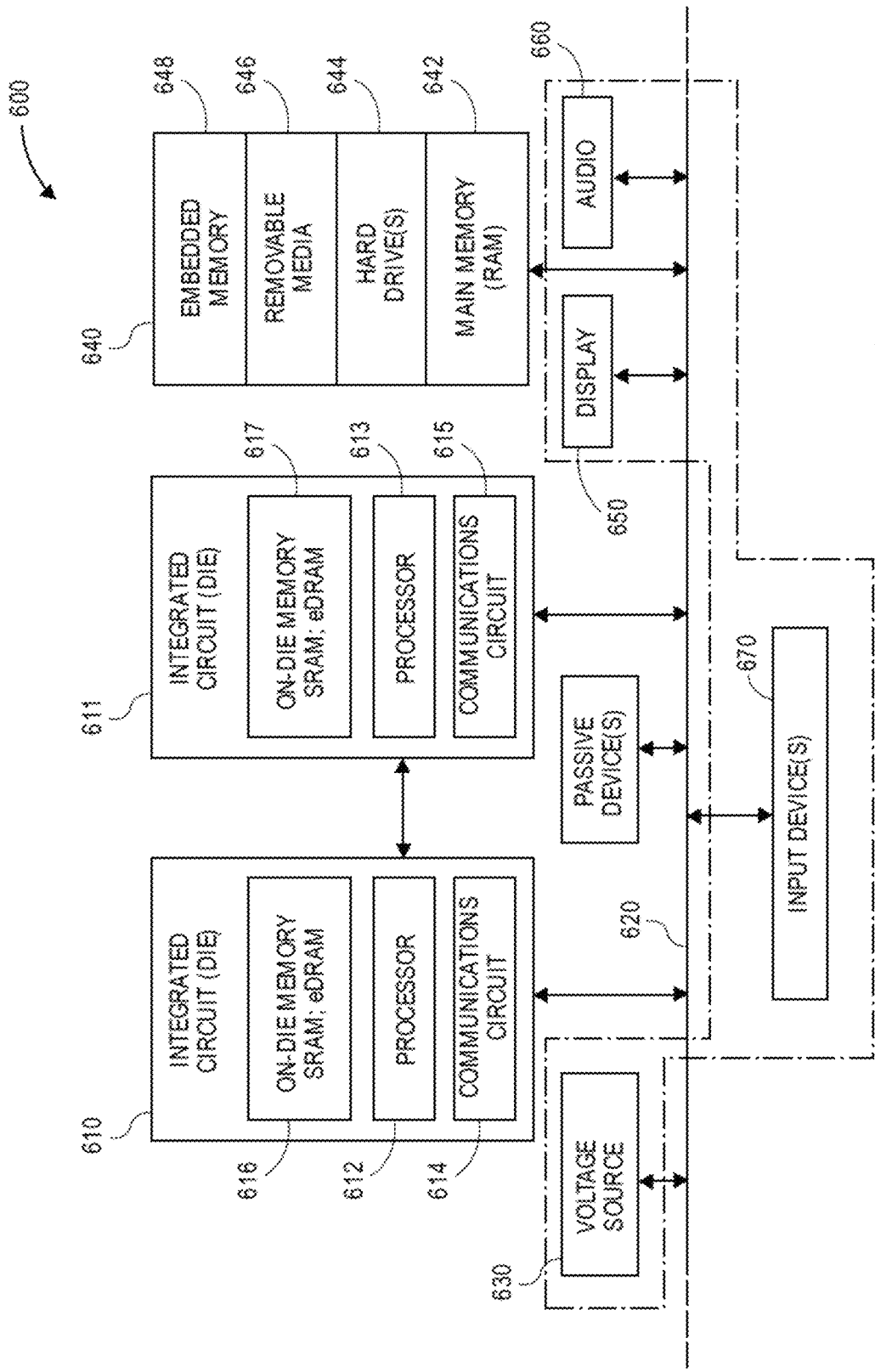
FIG. 6 schematically illustrates a computing device, in accordance with embodiments.

FIG. 6 schematically illustrates a computing device, in accordance with embodiments. The computer system 600 (also referred to as the electronic system 600) as depicted can embody a substrate with thermal insulation, according to any of the several disclosed embodiments and their equivalents as set forth in this disclosure. The computer system 600 may be a mobile device such as a netbook computer. The computer system 600 may be a mobile device such as a wireless smart phone. The computer system 600 may be a desktop computer. The computer system 600 may be a hand-held reader. The computer system 600 may be a server system. The computer system 600 may be a supercomputer or high-performance computing system.

In an embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

The integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. In an embodiment, the processor 612 includes, or is coupled with, a substrate with thermal insulation, as disclosed herein. In an embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems, or a communications circuit for servers. In an embodiment, the integrated circuit 610 includes on-die memory 616 such as static random-access memory (SRAM). In an embodiment, the integrated circuit 610 includes embedded on-die memory 616 such as embedded dynamic random-access memory (eDRAM).

In an embodiment, the integrated circuit 610 is complemented with a subsequent integrated circuit 611. Useful embodiments include a dual processor 613 and a dual communications circuit 615 and dual on-die memory 616 such as SRAM. In an embodiment, the dual integrated circuit 610 includes embedded on-die memory 616 such as eDRAM.

In an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 such as the first die in a die stack, according to an embodiment.

In an embodiment, the electronic system 600 also includes a display device 650, an audio output 660. In an embodiment, the electronic system 600 includes an input device such as a controller 670 that may be a keyboard, mouse, trackball, game controller, microphone, voice-recognition device, or any other input device that inputs information into the electronic system 600. In an embodiment, an input device 660 is a camera. In an embodiment, an input device 660 is a digital sound recorder. In an embodiment, an input device 660 is a camera and a digital sound recorder.

As shown herein, the integrated circuit 610 can be implemented in a number of different embodiments, including a package substrate having a substrate with thermal insulation, according to any of the several disclosed embodiments and their equivalents, an electronic system, a computer system, one or more methods of fabricating an integrated circuit, and one or more methods of fabricating an electronic assembly that includes a substrate with thermal insulation, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having thermal insulation and their equivalents. A foundation substrate may be included, as represented by the dashed line of FIG. 6. Passive devices may also be included, as is also depicted in FIG. 6.

EXAMPLES

The following paragraphs describe examples of various embodiments.

Example 1 is an apparatus comprising: a substrate; a first region of the substrate to be coupled with a die; a second region of the substrate adjacent to the first region of the substrate, wherein the first region and the second region are separate and distinct regions and the second region has a lower thermal conductivity than the first region; and wherein the second region is to thermally insulate a portion of the first region when the die is coupled to the first region.

Example 2 may include the apparatus of example 1, wherein the first region includes one or more thermally conductive layers in the substrate.

Example 3 may include the apparatus of example 2, wherein the second region includes fewer thermally conductive layers then the first region.

Example 4 may include the apparatus of example 2, wherein the conductive layers are metallic layers.

Example 5 may include the apparatus of example 4, wherein the metallic layers include copper.

Example 6 may include the apparatus of example 1, wherein the second region is a volume removed from the substrate.

Example 7 may include the apparatus of example 1, wherein the second region is a dielectric.

Example 8 may include the apparatus of any one of examples 1-7, further comprising a third region of the substrate adjacent to the first region of the substrate, wherein the first region, the second region, and the third region are different regions and the third region has a lower thermal conductivity than the first region.

Example 9 is a package, comprising: a substrate; a die directly coupled with a first region of the substrate; a second region of the substrate adjacent to the first region of the substrate, wherein the first region and the second region are different regions and the second region has a lower thermal conductivity than the first region; and wherein the second region is to reduce thermal energy loss in the first region when the die is coupled to the first region.

Example 10 may include the package of example 9, wherein the die coupled with the first region of the substrate further includes a solder connection; and wherein the solder connection is proximate to the second region.

Example 11 may include the package of example 10, wherein the solder connection is proximate to a corner of the substrate.

Example 12 may include the package of example 10, wherein the solder connection is at a corner or an edge of the die.

Example 13 may include the package of example 9, wherein the first region includes one or more thermally conductive layers in the substrate and wherein the second region includes fewer conductive layers then the first region.

Example 14 may include the package of example 9, wherein the thermally conductive layers are metallic layers that include copper.

Example 15 may include the package of example 9, wherein the first region and the second region are arranged to retain thermal energy in the first region during thermal compression bonding of the die to the substrate.

Example 16 may include the package of any one of examples 10-15, wherein the second region is disposed between the first region and an edge of the substrate.

Example 17 is a method, comprising: removing a region from a substrate to form a cavity, wherein the cavity is adjacent to a second region of the substrate, and wherein the substrate includes one or more layers of thermally conductive material; and coupling a die with one or more solder connections to the second region of the substrate using a thermal process, wherein a solder connection of the die to the second region is proximate to the cavity.

Example 18 may include the method of example 17, wherein the thermal process is a thermal compression bonding (TCB) process.

Example 19 may include the method of example 17, further comprising after the removing step, filling in the cavity with a material having a lower thermal conductivity than the second region.

Example 20 may include the method of any one of examples 17-19, wherein the material is a dielectric material.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An apparatus comprising:
   a substrate;
   a first region of the substrate to be coupled with a die;
   a second region of the substrate adjacent to the first region of the substrate, wherein the first region and the second region are separate and distinct regions and the second region has a lower thermal conductivity than the first region, and wherein the second region comprises a plurality of discrete portions; and
   wherein the second region is to thermally insulate a portion of the first region when the die is coupled to the first region.

2. The apparatus of claim 1, wherein the first region includes one or more thermally conductive layers in the substrate.

3. The apparatus of claim 2, wherein the second region includes fewer thermally conductive layers then the first region.

4. The apparatus of claim 2, wherein the conductive layers are metallic layers.

5. The apparatus of claim 4, wherein the metallic layers include copper.

6. The apparatus of claim 1, wherein the second region is a volume removed from the substrate.

7. The apparatus of claim 1, wherein the second region is a dielectric.

8. The apparatus of claim 1, further comprising a third region of the substrate adjacent to the first region of the substrate, wherein the first region, the second region, and the third region are different regions and the third region has a lower thermal conductivity than the first region.

9. A package, comprising:
   a substrate;
   a die directly coupled with a first region of the substrate;
   a second region of the substrate adjacent to the first region of the substrate, wherein the first region and the second region are different regions and the second region has a lower thermal conductivity than the first region, and wherein the second region comprises a plurality of discrete portions; and
   wherein the second region is to reduce thermal energy loss in the first region when the die is coupled to the first region.

10. The package of claim 9, wherein the die coupled with the first region of the substrate further includes a solder connection; and
    wherein the solder connection is proximate to the second region.

11. The package of claim 10, wherein the solder connection is proximate to a corner of the substrate.

12. The package of claim 10, wherein the solder connection is at a corner or an edge of the die.

13. The package of claim 9, wherein the first region includes one or more thermally conductive layers in the substrate and wherein the second region includes fewer conductive layers then the first region.

14. The package of claim 9, wherein the thermally conductive layers are metallic layers that include copper.

15. The package of claim 9, wherein the first region and the second region are arranged to retain thermal energy in the first region during thermal compression bonding of the die to the substrate.

16. The package of claim 15, wherein the second region is disposed between the first region and an edge of the substrate.

* * * * *